US012618542B2

(12) United States Patent
Kim et al.

(10) Patent No.: US 12,618,542 B2
(45) Date of Patent: May 5, 2026

(54) DISPLAY DEVICE, BACKLIGHT UNIT, LIGHT EMITTING MODULE AND LENS

(71) Applicant: SEOUL SEMICONDUCTOR CO., LTD., Ansan-si (KR)

(72) Inventors: Eun Ju Kim, Ansan-si (KR); Jae Eun Park, Ansan-si (KR)

(73) Assignee: SEOUL SEMICONDUCTOR CO., LTD., Ansan-si (KR)

( * ) Notice: Subject to any disclaimer, the term of this patent is extended or adjusted under 35 U.S.C. 154(b) by 0 days.

(21) Appl. No.: 19/057,016

(22) Filed: Feb. 19, 2025

(65) Prior Publication Data

US 2025/0189099 A1      Jun. 12, 2025

Related U.S. Application Data

(63) Continuation of application No. 18/339,782, filed on Jun. 22, 2023, now Pat. No. 12,259,124, which is a
(Continued)

(30) Foreign Application Priority Data

Feb. 28, 2017      (KR) ........................ 10-2017-0026197
Feb. 21, 2018      (KR) ........................ 10-2018-0020302

(51) Int. Cl.
*F21V 5/04*        (2006.01)
*H01L 25/075*      (2006.01)
(Continued)

(52) U.S. Cl.
CPC ............ *F21V 5/04* (2013.01); *H01L 25/0753* (2013.01); *H10H 20/855* (2025.01); *F21Y 2115/10* (2016.08)

(58) Field of Classification Search
CPC ..... F21V 5/04; H01L 25/0753; H10H 20/855; H10H 20/0363; F21Y 2115/10;
(Continued)

(56) References Cited

U.S. PATENT DOCUMENTS 7,866,844 B2      1/2011  Yamaguchi
8,558,967 B2      10/2013  Iiyama
(Continued)

FOREIGN PATENT DOCUMENTS

CN      102691895 A      9/2012
CN      104040740        9/2014
(Continued)

OTHER PUBLICATIONS

European Office Action dated Jul. 11, 2022, for European Patent Application No. 18760381.6.
(Continued)

*Primary Examiner* — Evan P Dzierzynski
(74) *Attorney, Agent, or Firm* — Oblon, McClelland, Maier & Neustadt, L.L.P.

(57)            ABSTRACT
A lens including a light entering part having a concave shape in a lower region of the lens, and on which light emitted from a light emitting device is to be incident, and a light exiting part through which the incident light is emitted to an outside of the lens, in which each of the light entering part and the light exiting part has a major axis and a minor axis in plan view, and the major axis of the light entering part is orthogonal to the major axis of the light exiting part, the light entering part includes a light incident vertical surface extending from a lower surface of the lens, and a light incident inclined surface extending upward from the light incident vertical surface, and the light incident vertical surface surrounds the light emitting device.

20 Claims, 11 Drawing Sheets

Related U.S. Application Data continuation of application No. 17/506,695, filed on Oct. 21, 2021, now Pat. No. 11,725,800, which is a continuation of application No. 16/504,338, filed on Jul. 8, 2019, now Pat. No. 11,199,307, which is a continuation of application No. PCT/KR2018/002377, filed on Feb. 27, 2018.

(51) Int. Cl.
  *H10H 20/855*    (2025.01)
  *F21Y 115/10*    (2016.01)

(58) Field of Classification Search
  CPC ......... G02F 1/133607; G02F 1/133603; G02F 1/133606; G02B 19/0066
  See application file for complete search history.

(56)            References Cited

U.S. PATENT DOCUMENTS

| 9,134,007 | B2 | 9/2015 | Wang |
| 9,683,719 | B2 | 6/2017 | Takatori |
| 10,060,579 | B2 | 8/2018 | Kim et al. |
| 10,139,077 | B2 | 11/2018 | Kang et al. |
| 10,203,086 | B2 | 2/2019 | Kang |
| 2008/0303757 | A1 | 12/2008 | Ohkawa |
| 2009/0116245 | A1 | 5/2009 | Yamaguchi |
| 2011/0116272 | A1 | 5/2011 | Bak |
| 2011/0121341 | A1 | 5/2011 | Lee |
| 2012/0050889 | A1 | 3/2012 | Lu et al. |
| 2012/0057101 | A1 | 3/2012 | Iiyama |
| 2012/0057354 | A1 | 3/2012 | Lee et al. |
| 2013/0051030 | A1 | 2/2013 | Lee et al. |
| 2013/0114021 | A1 | 5/2013 | Iiyama |
| 2013/0168726 | A1 | 7/2013 | Park |
| 2015/0138757 | A1* | 5/2015 | Dai .......................... F21V 13/04 362/97.1 |
| 2015/0192255 | A1 | 7/2015 | Kim et al. |
| 2016/0033108 | A1 | 2/2016 | Ji |
| 2016/0201875 | A1 | 7/2016 | Kang et al. |
| 2016/0230954 | A1* | 8/2016 | Ha ..................... G02B 19/0061 |
| 2016/0356451 | A1 | 12/2016 | Lin et al. |
| 2017/0234507 | A1* | 8/2017 | Kang ................. G02B 19/0014 362/237 |

FOREIGN PATENT DOCUMENTS

| EP | 2317216 | 5/2011 |
| EP | 3208533 | 8/2017 |
| JP | 2013-7805 | 1/2013 |
| JP | 2015-090772 | 5/2015 |
| JP | 2016-127030 | 7/2016 |
| KR | 10-1146458 | 5/2012 |
| KR | 10-2013-0073319 | 7/2013 |
| KR | 10-1690740 | 12/2016 |

OTHER PUBLICATIONS

Non-Final Office Action dated Jan. 6, 2021, in U.S. Appl. No. 16/504,338.
Final Office Action dated Jun. 3, 2021, in U.S. Appl. No. 16/504,338.
Notice of Allowance dated Aug. 9, 2021, in U.S. Appl. No. 16/504,338.
Corrected Notice of Allowance dated Aug. 18, 2021, in U.S. Appl. No. 16/504,338.
Extended European Search Report dated Nov. 24, 2020, issued in European Patent Application No. 18760381.6.
Extend European Search Report mailed Jul. 1, 2024 in Application No. 24165218.9 filed Feb. 27, 2018.
Office Action mailed Jan. 14, 2025, in Chinese Application No. 202210347915.4 filed Apr. 6, 2017.

* cited by examiner

DISPLAY DEVICE, BACKLIGHT UNIT, LIGHT EMITTING MODULE AND LENS

CROSS-REFERENCE TO RELATED APPLICATIONS

This application is a continuation of and claims benefit under 35 U.S.C. § 120 to U.S. application Ser. No. 18/339,782 filed Jun. 22, 2023, which is a continuation of and claims benefit under 35 U.S.C. § 120 to U.S. application Ser. No. 17/506,695 filed Oct. 21, 2021 (now U.S. Pat. No. 11,725,800 issued Aug. 15, 2023), which is a continuation of and claims benefit under 35 U.S.C. § 120 to U.S. application Ser. No. 16/504,338 filed Jul. 8, 2019 (now U.S. Pat. No. 11,199,307 issued Dec. 14, 2021), which is a Bypass Continuation of International Patent Application No. PCT/KR2018/002377 filed Feb. 27, 2018, and claims the benefit of priority under 35 U.S.C. § 119 from Korean Patent Application No. 10-2017-0026197 filed Feb. 28, 2017 and Korean Patent Application No. 10-2018-0020302 filed Feb. 21, 2018, the entire contents of each of which are incorporated herein by reference.

BACKGROUND

Field

Exemplary embodiments of the invention relate generally to a display device, a backlight unit, a light emitting module, and a lens, and more specifically, to a display device, a backlight unit, a light emitting module, and a lens capable of specifying a light emission distribution emitted to the outside.

Discussion of the Background

A light emitting diode is an inorganic semiconductor device, which emits light generated by recombination of electrons and holes. In recent years, light emitting diodes have been widely used in various fields, such as display devices, vehicular lamps, general lighting, and the like. With various advantages, such as longer lifespan, lower power consumption, and more rapid response compared to conventional light sources, the light emitting diodes have been rapidly replacing existing light sources in the art.

When using the light emitting diode for a display device or a general lighting, several to tens of light emitting diodes may be used. When using many light emitting diodes, optical interference between light emitting diodes should be minimized. Otherwise, interference of light emitted from each of the light emitting diodes may occur, which may generate shadows or partial hot spots.

The above information disclosed in this Background section is only for understanding of the background of the inventive concepts, and, therefore, it may contain information that does not constitute prior art.

SUMMARY

A display device, a backlight unit, a light emitting module, and a lens constructed according to exemplary embodiments of the invention are capable of minimizing or at least suppressing optical interference between light emitting diodes.

Additional features of the inventive concepts will be set forth in the description which follows, and in part will be apparent from the description, or may be learned by practice of the inventive concepts.

A light emitting module according to an exemplary embodiment includes a light emitting device, and a lens disposed on the light emitting device to spread light emitted from the light emitting device, in which the lens includes a light entering part on which light emitted from the light emitting device is incident, and a light exiting part through which the incident light is emitted, each of the light entering part and the light exiting part has a major axis and a minor axis in plan view, the major axis of the light entering part is orthogonal to the major axis of the light exiting part, and the light entering part includes a light incident vertical surface extending from a lower surface of the lens and a light incident inclined surface extending upward from the light incident vertical surface.

The lens may have a protruding part protruding from the lower surface of the lens with a predetermined curvature.

The light entering part may be formed upwardly in a concave shape from the protruding part of the lens, and an inner surface of the concave shape may include a light incident vertical surface extending from the protruding part of the lens and a light incident inclined surface extending from the light incident vertical surface.

The lens may further include a plurality of legs coupled to the lower surface of the lens to support the lens.

The plurality of legs may be disposed outside of the protruding part.

The lens may further include a flange connecting the light exiting part and the lower surface of the lens.

A height of the light incident vertical surface may be less than a thickness of the flange.

The thickness of the flange may be greater at a major axis of the light exiting part than that at a minor axis of the light exiting part.

A shortest distance from the end of the light exiting part of the lens at the major axis thereof to the end of the flange at the major axis of the flange may be different from a shortest distance from the end of the light exiting part of the lens at the minor axis thereof to the end of the flange at the minor axis of the flange.

A lens according to an exemplary embodiment includes a light entering part having a concave shape in a lower region of the lens, and on which light emitted from a light emitting device is to be incident, and a light exiting part through which the incident light is emitted to the outside, in which each of the light entering part and the light exiting part has a major axis and a minor axis in plan view, the major axis of the light entering part is orthogonal to the major axis of the light exiting part, and the light entering part includes a light incident vertical surface extending from a lower surface of the lens and a light incident inclined surface extending upward from the light incident vertical surface.

The lower surface may further include a protruding part protruding with a predetermined curvature to surround the light entering part.

An inner surface of the light entering part may include a light incident vertical surface extending from the protruding part and a light incident inclined surface extending from the light incident vertical surface.

The lens may further include a plurality of legs coupled to the lower surface of the lens, and the plurality of legs may be disposed outside of the protruding surface.

The lens may further include a flange connecting the light exiting part and the lower surface of the lens.

The thickness of the flange may be greater at a major axis of the light exiting part than that at a minor axis of the light exiting part.

A light emitting module according to an exemplary embodiment includes a substrate, a plurality of light emitting devices disposed on the substrate, and a lens disposed over at least one of the light emitting devices to spread light emitted from the light emitting devices, in which each of the lenses includes a light entering part on which light emitted from the light emitting device is incident, and a light exiting part through which the incident light is emitted to the outside, in which each of the light entering part and the light exiting part has a major axis and a minor axis in plan view, the major axis of the light entering part is orthogonal to the major axis of the light exiting part, and the light entering part includes a light incident vertical surface extending from a lower surface of the lens and a light incident inclined surface extending upward from the light incident vertical surface.

The at least one backlight module may be provided in plural, and the plurality of backlight modules may be disposed at predetermined intervals.

The substrate may have a predetermined length, and the plurality of backlight modules disposed at the predetermined interval may be disposed in a direction perpendicular to the longitudinal direction of the substrate.

The substrate may have a predetermined length, and the plurality of lenses may be arranged so that the major axis of the light exiting part is perpendicular to the longitudinal direction of the substrate.

The substrate may have a predetermined length, and a width of the light entering part in the minor axis direction may be less than a width of the substrate.

Each of the plurality of lenses may further include a plurality of legs arranged in the major axis direction.

A display device may include the backlight unit according to an exemplary embodiment.

It is to be understood that both the foregoing general description and the following detailed description are exemplary and explanatory and are intended to provide further explanation of the invention as claimed.

BRIEF DESCRIPTION OF DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
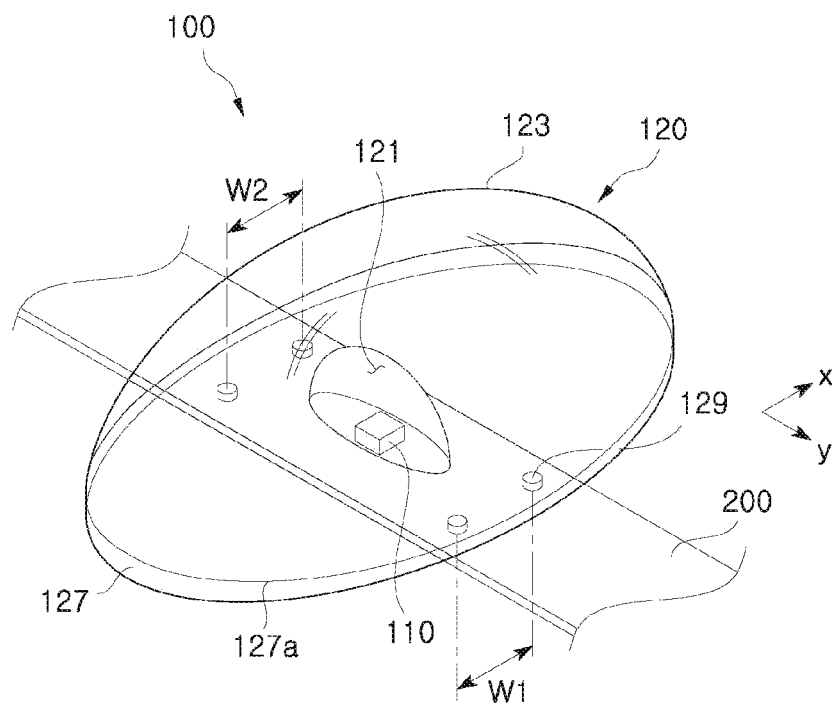
FIG. 1 is a perspective view of a light emitting module according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Exemplary embodiments of the invention will be described in detail with reference to the accompanying drawings.

Figure 2:
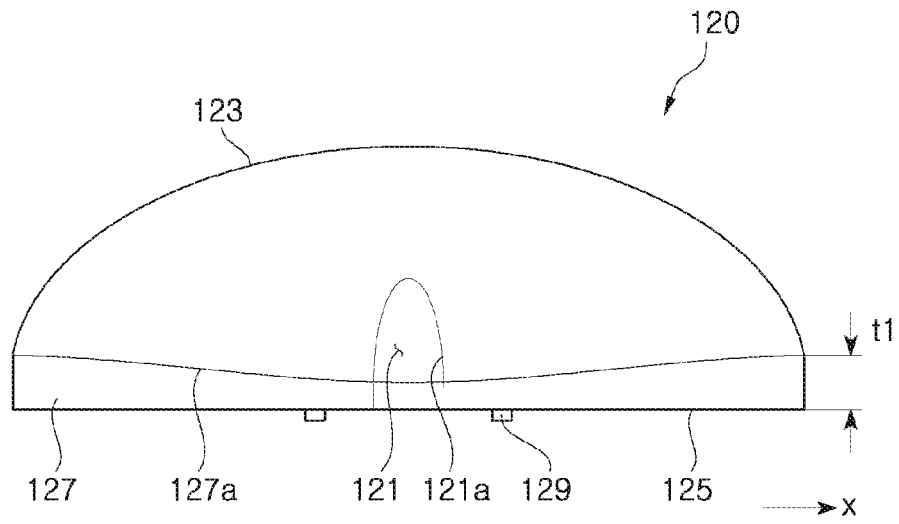
FIG. 2 is a cross-sectional view along a major axis of a lens included in the light emitting module of FIG. 1 according to an exemplary embodiment.
Figure 3:
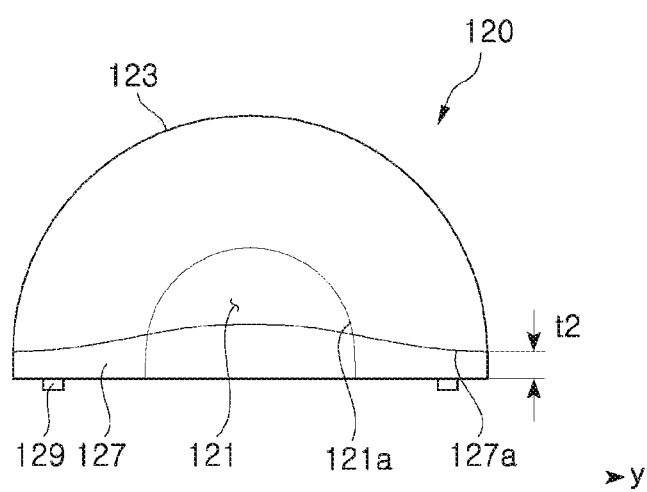
FIG. 3 is a cross-sectional view along a minor axis of the lens included in the light emitting module FIG. 1.

FIG. 1 is a perspective view of a light emitting module according to an exemplary embodiment, and FIG. 2 is a cross-sectional view along a major axis of a lens included in the light emitting module of FIG. 1 according to an exemplary embodiment. FIG. 3 is a cross-sectional along a minor axis of the lens included in the light emitting module of FIG. 1 according to an exemplary embodiment.

Referring to FIG. 1, a light emitting module 100 according to an exemplary embodiment includes a light emitting device 110 and a lens 120.

The light emitting device 110 is disposed on a substrate 200. The substrate 200 may have an insulation property, and a conductive circuit may be formed on an upper region thereof. The substrate 200 may support the light emitting device 110 and the lens 120. In an exemplary embodiment, the substrate 200 may be a printed circuit board, and may include a mounting groove on which the light emitting device 110 is mounted.

The light emitting device 110 may be disposed on the substrate 200, and may be mounted in the mounting groove when the mounting groove is formed on the substrate 200. The light emitting device 110 may be in the form of a package, in which a light emitting diode chip is mounted on a housing or a sub-mount, or in the form in which the light emitting diode chip is directly mounted on the substrate 200.

When the light emitting device 110 is in the form of the light emitting diode chip, the light emitting diode chip may include a light emitting structure including an n-type semiconductor layer, an active layer, and a p-type semiconductor layer. In some exemplary embodiments, the light emitting diode chip may be a flip chip type, in which an n-type electrode electrically connected to the n-type semiconductor layer and a p-type electrode electrically connected to the p-type semiconductor layer are arranged in one side, or may be a vertical type, in which the n-type electrode and the p-type electrode are arranged in different sides. Each of the n-type semiconductor layer, the active layer, and the p-type semiconductor layer may include a III-V compound semiconductor, for example, a nitride semiconductor, such as (Al, Ga, In) N.

The n-type semiconductor layer may be a conductive semiconductor layer including an n-type impurity (e.g., Si), and the p-type semiconductor layer may be a conductive semiconductor layer including a p-type impurity (e.g., Mg). The active layer may be interposed between the n-type semiconductor layer and the p-type semiconductor layer, and may include a multiple quantum well structure (MQW). A composition ratio of the active layer may be determined to emit light having a desired peak wavelength. In the illustrated exemplary embodiment, the composition ratio of the light emitting diode chip may be determined to emit blue light or ultraviolet light to the outside.

The lens 120 is provided to spread light emitted from the light emitting device 110, and is disposed to cover the light emitting device 110. The lens 120 may have a light incident surface 121a on which light emitted from the light emitting device 110 is incident, and a light exiting part 123 through which light is emitted to the outside from the lens 120. In the illustrated exemplary embodiment, the lens 120 includes a light entering part 121 having a concave shape in a lower region thereof, and an inner surface of the light entering part 121 may be the light incident surface 121a.

The light entering part 121 may be formed in the lower region of the lens 120, and may be disposed at a center of the lens 120 as shown in the drawings. A shape of the light entering part 121 may be concave or a substantially half-elliptical shape as shown in FIGS. 1 to 3. In the illustrated exemplary embodiment, the minor axis direction of the elliptical light entering part 121 is defined as an x-axis direction, and the major axis direction of light entering part 121 is defined as a y-axis direction.

The light incident surface 121a, which is the inner surface of the light entering part 121, may have a curved surface as a whole. The light incident surface 121a and a lower surface 125 of the lens 120 may be connected to each other by the curved surface. However, the inventive concepts are not limited thereto, and in some exemplary embodiments, an upper most region of the light incident surface 121a may include a flat surface, for example.

In the illustrated exemplary embodiment, the lower surface 125 of the lens 120 may have a planar shape, as shown in the drawings. However, the inventive concepts are not limited thereto, and in some exemplary embodiments, the lower surface 125 of the lens 120 may include an inclined surface. In this case, the inclined surface may be inclined upward from the light entering part 121 toward an outer surface of the lens 120.

The light exiting part 123 forms an outer shape of the lens 120 with a surface through which the light incident on the lens 120 is emitted to the outside. A cross-sectional view of the light exiting part 123 along a major axis in the x-axis direction may have a substantially elliptical shape. In the illustrated exemplary embodiment, the minor axis direction of the elliptical light exiting part 123 is the y-axis direction, and the major axis direction of the light exiting part 123 is the x-axis direction. More particularly, the major axis of the light entering part 121 and the major axis of the light exiting part 123 are arranged perpendicular to each other.

The light entering part 121 having the elliptical shape may have a greater ratio of the major axis to the minor axis than that of the light exiting part 123. More particularly, the elliptical shape of the light exiting part 123 may be closer to a circular shape than that of the light entering part 121.

Accordingly, greater amount of light emitted from the light emitting device 110 may be incident toward the major axis of the light exiting part 123.

As such, in the cross-sectional view taken along the x-axis direction of the lens 120 as shown in FIG. 2, the light exiting part 123 is disposed along the major axis direction, and the light entering part 121 is disposed along the minor axis direction. In the cross-sectional view taken along the y-axis direction of the lens 120 as shown in FIG. 3, the light exiting part 123 is disposed along the minor axis direction, and the light entering part 121 is disposed along the major axis direction. As such, light incident on the lens 120 through the minor axis direction of the light entering part 121 has a relatively longer transmission distance within the lens 120 than light incident on the lens 120 through the major axis direction of the light entering part 121.

The lens 120 may further include a flange 127 connecting the light exiting part 123 and the lower surface of the lens 120. The flange 127 may be disposed along an outer periphery of the light exiting part 123, and a longitudinal side surface of the flange 127 may be substantially perpendicular to the lower surface 125 of the lens 120. In this case, a thickness of the flange 127 may vary depending on a location of a light emitting surface. In the illustrated exemplary embodiment, a thickness "t1" of the flange 127 located at the major axis of the light exiting part 123 may be relatively thicker than a thickness "t2" of the flange 127 located at the minor axis of the light exiting part 123. The thickness of the flange 127 may be the thickest at the major axis of the light exiting part 123 and the thinnest at the minor axis of the light exiting part 123. In an exemplary embodiment, a boundary 127a between the flange 127 and the light exiting part 123 may be formed as a curved line as shown in FIGS. 1 to 3.

A plurality of legs 129 may be disposed on the lower surface 125 of the lens 120. The legs 129 may be disposed around the light entering part 121 and may have a predetermined thickness, and may function as a mark for an alignment when the when the lens 120 is coupled to the substrate 200.

The plurality of legs 129 may be disposed at a longer interval along the major axis of the light entering part 121. For example, four legs 129 may be formed on the lens 120 according to an exemplary embodiment, two of which may be disposed at a first interval W1 on one side of the light entering part 121 at the major axis, and the remaining two legs 129 may be disposed at a second interval W2 on an opposite side to the one side of the light entering part 121 at the major axis. In this case, the first interval W1 and the second interval W2 may be substantially equal to each other. An interval between the two legs 129 disposed on the one side of the light entering part 121 and the two legs 129 disposed on the other side may be longer than the first and second intervals W1 and W2.

Figure 4:
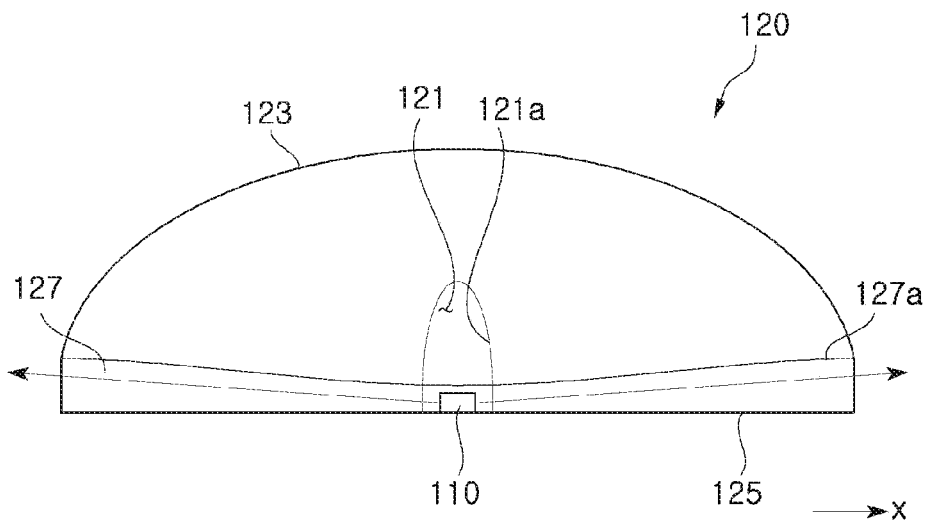
FIG. 4 is a cross-sectional view along a major axis of the light emitting module of FIG. 1 according to another exemplary embodiment.

FIG. 4 is a cross-sectional view along a major axis of the light emitting module of FIG. 1 according to an exemplary embodiment.

Referring to FIG. 4, the light emitting device 110 of the light emitting module 100 of FIG. 1 according to an exemplary embodiment is disposed in the light entering part 121 of the lens 120, as shown in the drawing. In the illustrated exemplary embodiment, the light emitting device 110 may be a flip chip type light emitting device 110, and accordingly, the light emitting device 110 emits light upwards and sidewards from the light emitting device 110.

Light emitted upwards from the light emitting device 110 may be emitted to the outside through the light exiting part 123 via the light entering part 121 of the lens 120. A portion of the light emitted sidewards from the light emitting device 110 may be emitted to the outside through the light exiting part 123 via the light entering part 121, but the light incident on the light entering part 121 may be emitted to the outside through the flange 127 as shown in the drawing. Accordingly, light emitted through the flange 127 may be emitted to the outside without being refracted by the lens 120, thereby increasing the amount of light emitted from the side surface of the lens 120.

In the illustrated exemplary embodiment, the thickness of the major axis of the flange 127 is different from that of the minor axis of the flange 127. As such, an amount of light emitted to the major axis may be relatively larger than an amount of light emitted to the minor axis of the lens 120. More particularly, as the thickness of the flange 127 is thicker, an amount of light exiting the lens 120 through the flange 127 without being refracted by then lens 120 may be increased. As such, the amount of light emitted to the major axis of the lens 120, in which the relatively thicker flange 127 is formed, may be greater than that emitted to the minor axis of the lens 120.

As such, the lens 120 according to the illustrated exemplary embodiment may spread light more in the major axis direction than in the minor axis direction.

Figure 5:
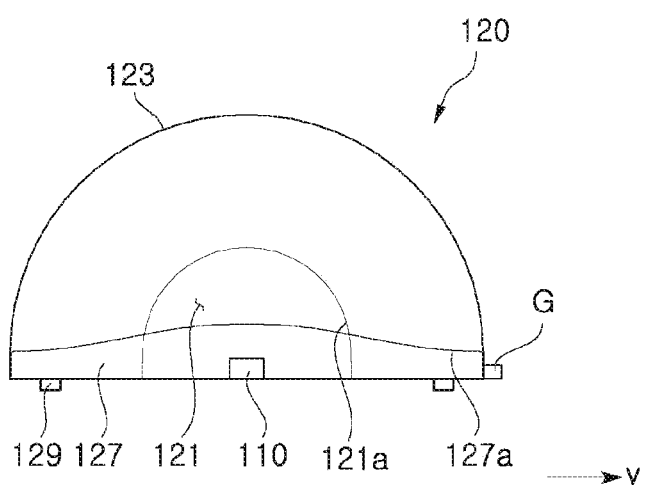
FIG. 5 is a cross-sectional view along a minor axis of the light emitting module of FIG. 1 according to another exemplary embodiment.

FIG. 5 is a cross-sectional view along a minor axis of the light emitting module of FIG. 1 according to an exemplary embodiment.

Referring to FIG. 5, the lens 120 of the light emitting module 100 of FIG. 1 according to an exemplary embodiment may be formed through injection. As such, a shape of a gate G for the injection mold may be formed in the flange 127 of the lens 120. In this case, a thickness of the flange 127 at the minor axis may be determined by a thickness of the gate G, and in some exemplary embodiments, the flange 127 may be formed thicker than the gate G.

In the illustrated exemplary embodiment, the thickness of the flange 127 may be greater at the major axis than at the minor axis, and may be less than 4 mm. Further, the thickness of the flange 127 at the minor axis may be in a range of 0.3 mm to 1 mm.

Figure 6:
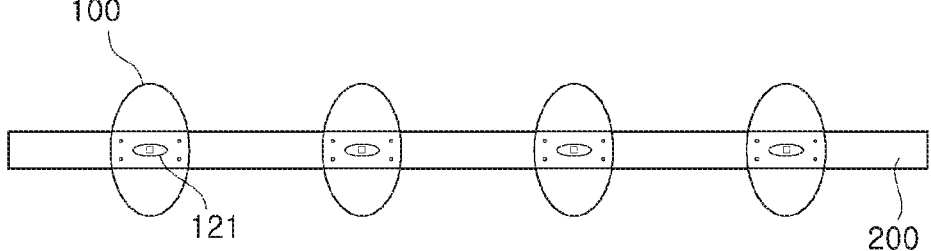
FIG. 6 is a view of the light emitting module mounted on a substrate according to an exemplary embodiment.

FIG. 6 is a view of the light emitting module mounted on the substrate 200 according to an exemplary embodiment.

Referring to FIG. 6, a plurality of light emitting modules 100 may be disposed on the substrate 200. The substrate 200 may have a substantially elongated shape, such as a bar, having the longitudinal direction. The substrate 200 may include a conductive circuit to supply power to the light emitting device 110 mounted on an upper surface of the substrate 200. The light emitting module may be formed by disposing lenses 120 to cover a plurality of light emitting devices 110 when the light emitting devices 110 are coupled to the conductive circuit of the substrate 200.

As shown in FIG. 6, the lens 120 may be disposed on substrate 200 such that the major axis direction of the light entering part 121 coincides with the longitudinal direction of the substrate 200. Accordingly, the major axis of the light exiting part 123 of the lens 120 may be arranged perpendicular to the longitudinal direction of the substrate 200, and the lens 120 may be relatively protruding to an outer surface of the substrate 200. Further, a width of the light entering part 121 of the lens 120 in the minor axis direction may be smaller than a width of the substrate 200. The legs 129 of the lens 120 may be coupled to the substrate 200, and thus, the lens 120 may be coupled to the substrate 200.

Figure 7:
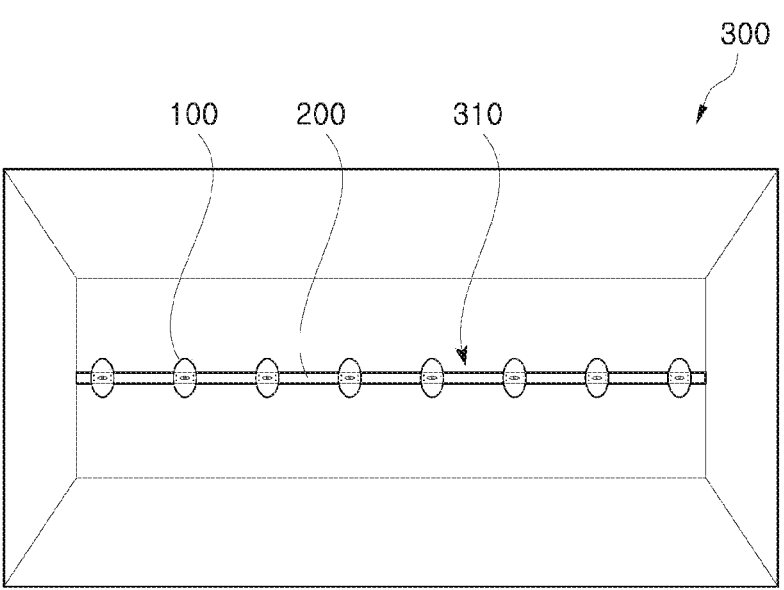
FIG. 7 is a view of a backlight unit of a 32-inch display device equipped with the light emitting module according to an exemplary embodiment.
Figure 8:
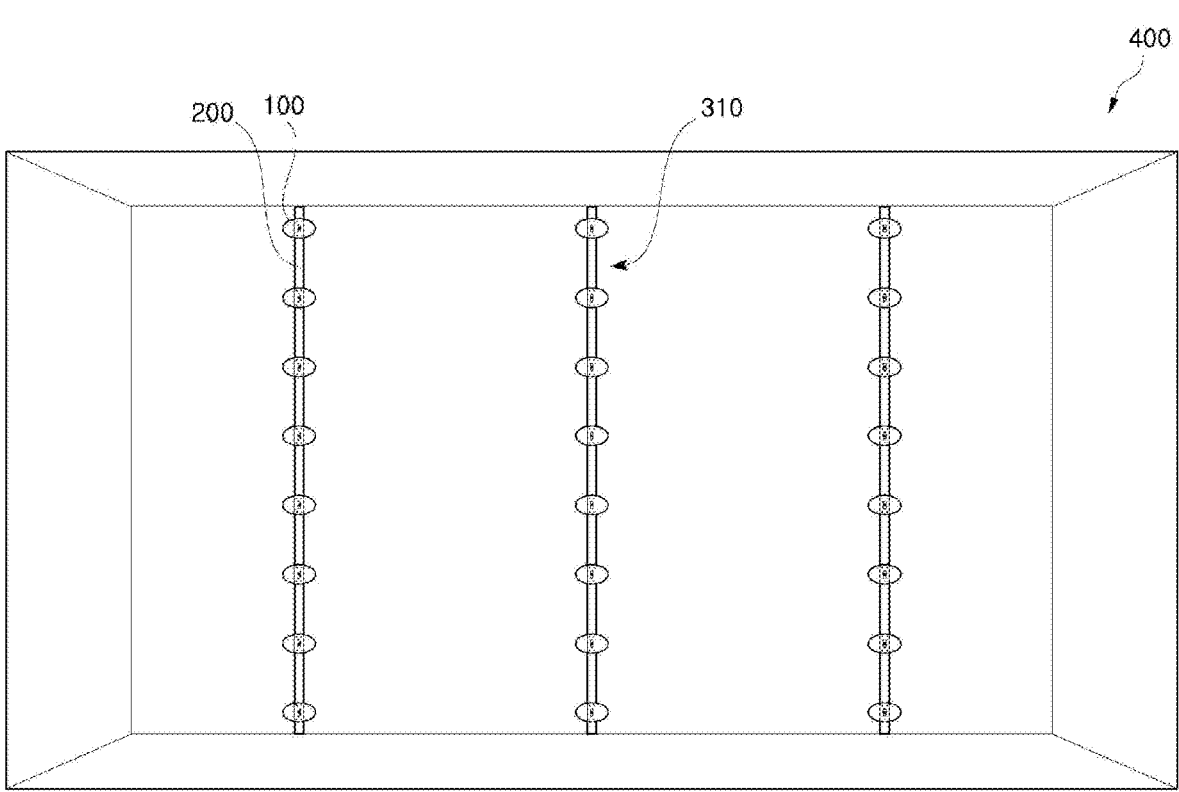
FIG. 8 is a view of a backlight unit of a 55-inch display device equipped with the light emitting module according to an exemplary embodiment.

FIG. 7 is a view of a backlight unit of a 32-inch display device equipped with the light emitting module according to an exemplary embodiment, and FIG. 8 is a view of a backlight unit of a 55-inch display device equipped with the light emitting module according to an exemplary embodiment.

Referring to FIG. 7, a backlight unit 300 of the 32-inch display device according to an exemplary embodiment may include a backlight module 310. The backlight module 310 may include a plurality of light emitting modules 100 arranged at regular intervals on the substrate 200 having a predetermined length.

In this case, one backlight module 310 may be installed in the 32-inch backlight unit 300, and the backlight module 310 may be disposed at a center of the backlight unit 300 in the longitudinal direction of the backlight unit 300. Accordingly, light emitted from the plurality of light emitting modules 100 may be emitted in a direction perpendicular to the longitudinal direction of the substrate 200 and irradiated onto an entire surface of the backlight unit 300.

Referring to FIG. 8, a backlight unit 400 of the 55-inch display device according to an exemplary embodiment may have three backlight modules 310 each arranged in a direction perpendicular to the longitudinal direction of the backlight unit 400. The backlight module 310, as shown in the drawing, includes the substrate 200 having an one-directional length and the plurality of light emitting modules 100 disposed on the substrate 200. Accordingly, the backlight module 310 has the one-directional length as in the substrate 200. The three backlight modules 310 disposed in the backlight unit 400 of the 55-inch display device may be disposed in a direction perpendicular to the longitudinal direction of the backlight module 310.

Each of the backlight modules 310 may include the plurality of light emitting modules 100 on the single substrate 200. Light emitted from each light emitting module 100 may be emitted with a light distribution characteristic having the direction perpendicular to the longitudinal direction of the substrate 200, and thus, light may be irradiated onto an entire surface of the backlight unit 400.

In this case, the number of the backlight modules 310 disposed and the number of the light emitting modules 100 disposed on the substrate 200 may be different depending on a size of the display device.

Figure 9:
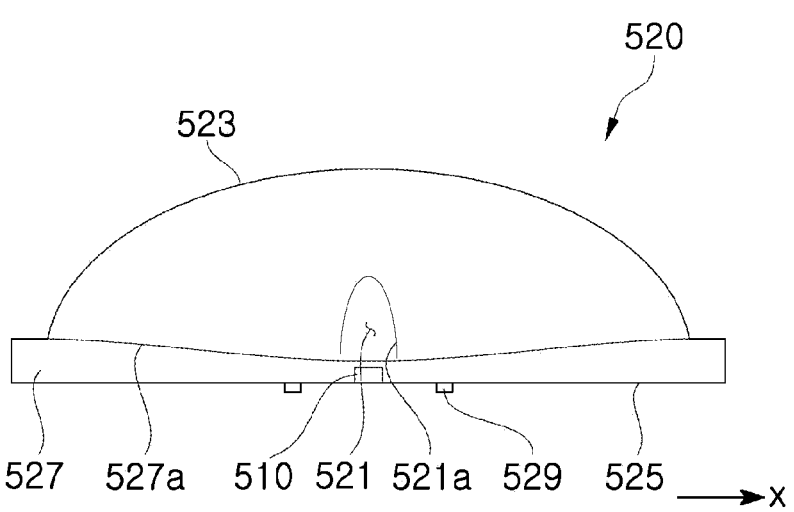
FIG. 9 is a cross-sectional view along a major axis of a lens included in a light emitting module according to another exemplary embodiment.
Figure 10:
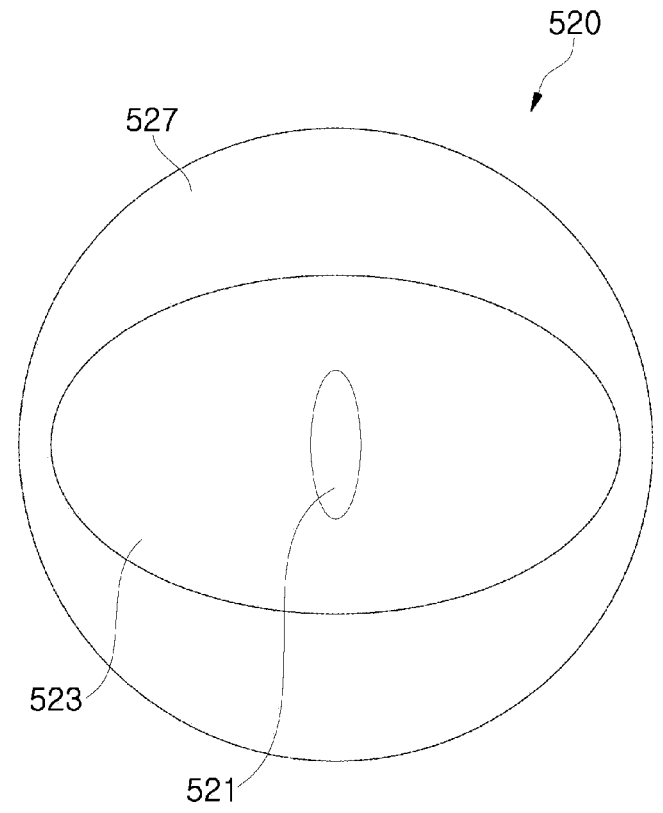
FIG. 10 is a plan view of the lens included in the light emitting module of FIG. 9 according to an exemplary embodiment.

FIG. 9 is a cross-sectional view along a major axis of a lens included in a light emitting module according to another exemplary embodiment, and FIG. 10 is a plan view of the lens included in the light emitting module of FIG. 9 according to an exemplary embodiment.

Referring to FIGS. 9 and 10, a light emitting module 500 according to an exemplary embodiment includes a light emitting device 510 and a lens 520. In the illustrated exemplary embodiment, the configuration of the light emitting device 500 is substantially the same as that shown in FIGS. 1 to 3, and thus, repeated descriptions thereof and to some of the substantially similar features of the lens 520 will be omitted to avoid redundancy.

In the illustrated exemplary embodiment, the lens 520 includes a light entering part 521, a light exiting part 523, a flange 527, and legs 529. The configurations of the light entering part 521, the light exiting part 523, and the legs 529 are substantially the same as those described above with reference to FIGS. 1 to 3. The flange 527 according to the illustrated exemplary embodiment may protrude to an outer surface of the lens 520 at the light exiting part 523. More particularly, a width of the flange 527 may be relatively greater than a width of the light exiting part 523 of the lens 520 at the major axis (x-axis direction) as shown in FIG. 9.

Moreover, as shown in FIG. 10, the flange 527 may have a substantially circular shape in plan view. In particular, the light exiting part 523 of the lens 520 has a substantially elliptical shape, and the flange 527 has a substantially circular shape. Accordingly, a distance from an end of an outer surface of the flange 527 to an end of an outer surface of the light exiting part 523 may be different from each other at the major axis and the minor axis of the light exiting part 523.

Figure 11:
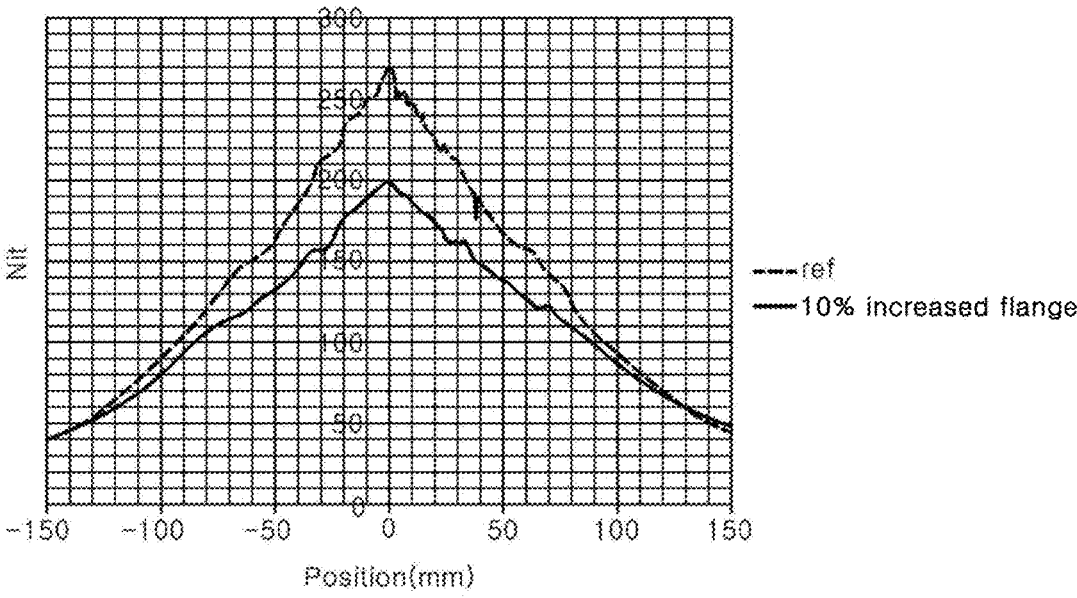
FIG. 11 is a graph illustrating a brightness of light emitted from the major axis of a light exiting part in the light emitting modules according to exemplary embodiments.
Figure 12:
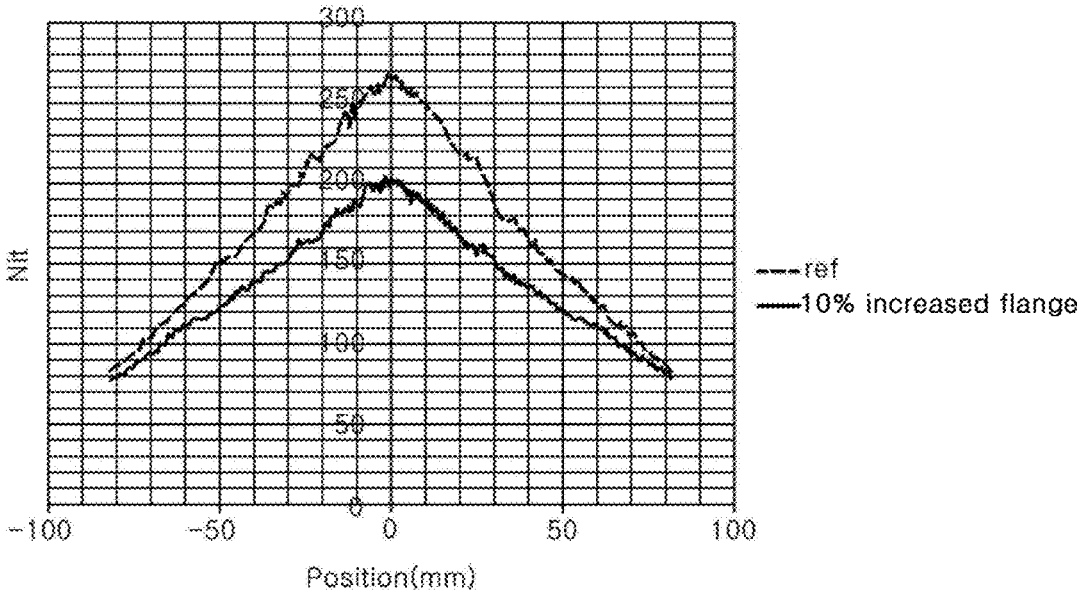
FIG. 12 is a graph illustrating a brightness of light emitted from the minor axis of the light exiting part in the light emitting modules according to exemplary embodiments.

FIG. 11 is a graph illustrating a brightness of light emitted from the major axis of the light exiting part in the light emitting modules according to exemplary embodiments. FIG. 12 is a graph illustrating a brightness of light emitted from the minor axis of the light exiting part in the light emitting modules according to exemplary embodiments.

A size and a shape of the flange 527 of the lens 520 included in the light emitting module 500 of FIG. 12 is different from those of the flange 127 of the lens 120 included in the light emitting module 100 of FIG. 1. Accordingly, the brightness of light emitted from the light emitting module 500 can be adjusted according to the size and shape of the flange 527. The brightness of light emitted from the light emitting module 500 can be adjusted by the size and shape of the flange 527 since light emitted from the light emitting module 500 may be reflected at a bottom of the substrate 200 or the backlight unit.

More particularly, referring back to FIG. 6, since the lens 520 is larger than the width of the substrate 200, light may be emitted to the outside through the lower surface 525 of the lens 520. Accordingly, if the size and shape of the flange 527 of the lens 520 are changed, an amount of light emitted through the lower surface 525 of the lens 520 may be changed.

As in the light emitting module of FIG. 9, when the size of the flange 527 is increased by 10% than that of the flange 127 of FIG. 1, the brightness of light emitted to the major axis direction with respect to the light exiting part of the lens 520 may be reduced by about 30% at the center. This is because the amount of light emitted through the lower surface 525 of the lens 520, with the lower surface 525 being exposed to the outside of the substrate 200, is greater than an amount of light reflected from the substrate 200 after being emitted through the lower surface 125 of the lens 120 of the light emitting module 100.

Also, as shown in FIG. 12, it can be seen that a center brightness of light emitted in the minor axis direction of the light exiting part of the lens 520 is reduced by about 30%.

Figure 13:
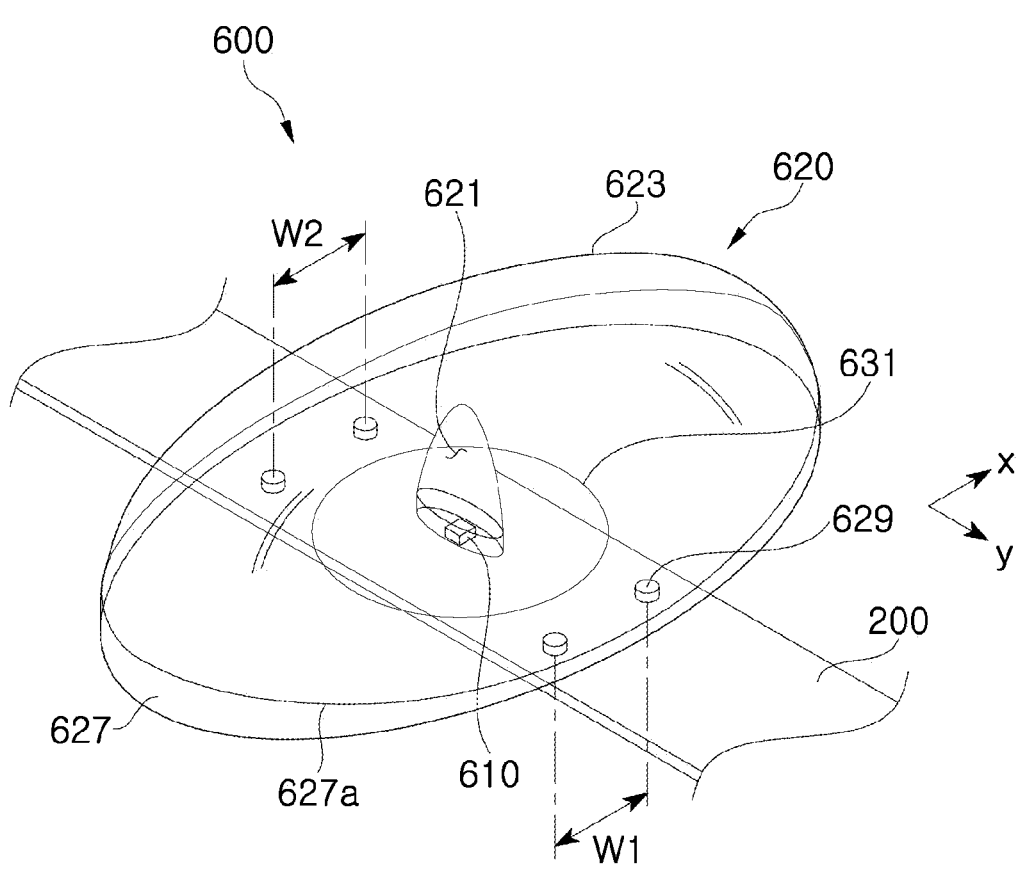
FIG. 13 is a perspective view of a light emitting module according to another exemplary embodiment.
Figure 14:
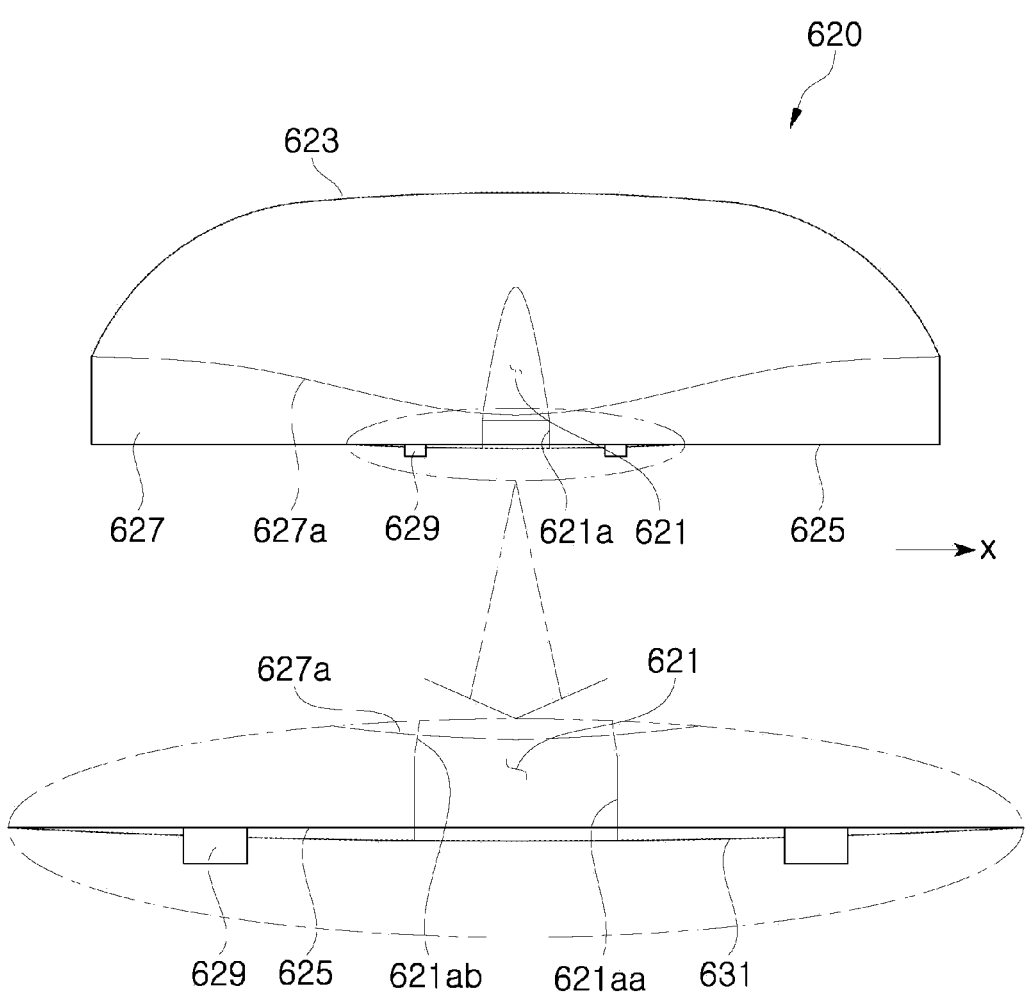
FIG. 14 is a side view along a major axis of a light exiting part of a lens included in the light emitting module of FIG. 13 according to an exemplary embodiment.
Figure 15:
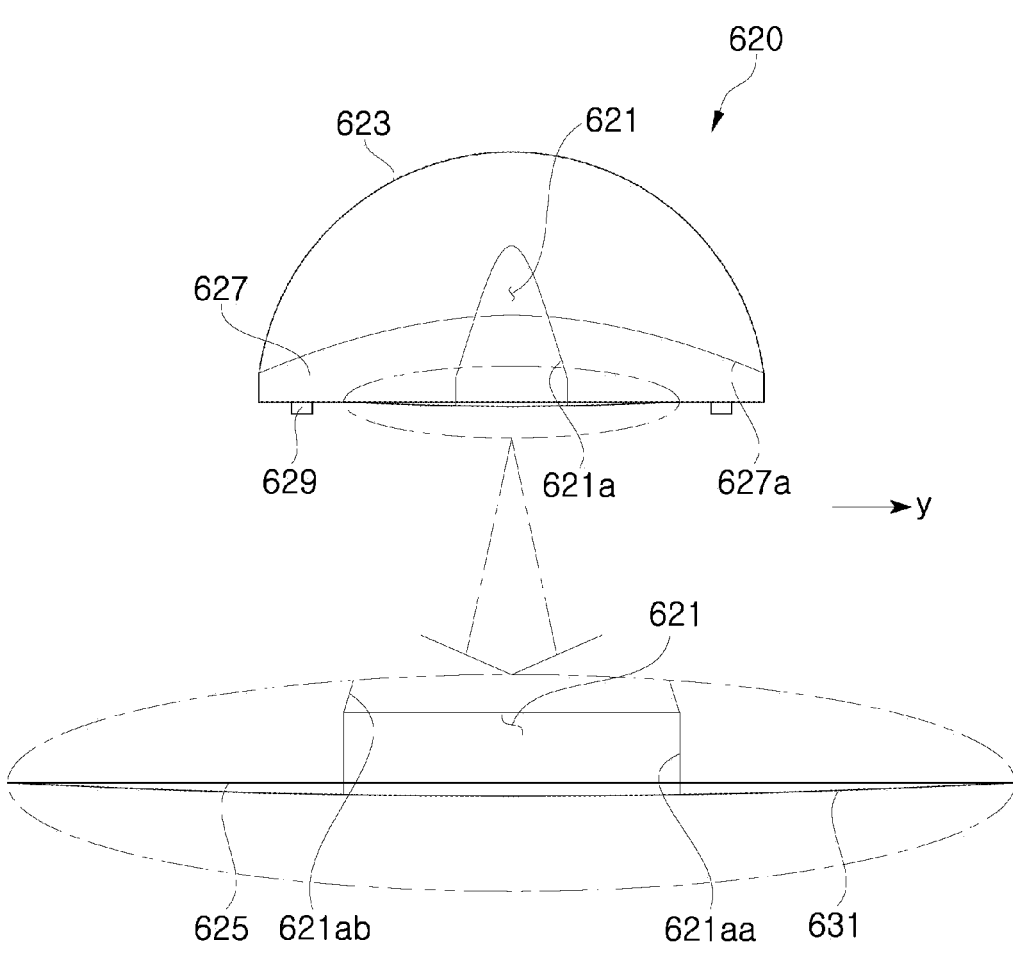
FIG. 15 is a side view along a minor axis of the light exiting part of the lens included in the light emitting module of FIG. 13 according to an exemplary embodiment.

FIG. 13 is a perspective view of a light emitting module according to an exemplary embodiment. FIG. 14 is a cross-sectional view along a major axis of a light exiting part of a lens included in the light emitting module of FIG. 13 according to an exemplary embodiment. FIG. 15 is a cross-sectional view along a minor axis of the light exiting part of the lens included in the light emitting module of FIG. 13 according to an exemplary embodiment.

Referring to FIG. 13, a light emitting module 600 according to an exemplary embodiment includes a light emitting device 610 and a lens 620.

The light emitting device 610 is disposed on the substrate 200, and the light emitting device 610 according to the illustrated exemplary embodiment is substantially the same as that of FIG. 1, and thus, repeated descriptions of some of the elements thereof will be omitted.

The lens 620 is provided to spread light emitted from the light emitting device 610, and is disposed to cover the light emitting device 610. Referring to FIG. 14, the lens 620 may have a light incident surface 621a, on which light emitted from the light emitting device 610 is incident, and a light exiting part 623 through which light is emitted to the outside from the lens 620. In the illustrated exemplary embodiment, the lens 620 includes a light entering part 621 having a substantially concave shape in a lower region thereof, and an inner surface of the light entering part 621 may be the light incident surface 621a.

The light entering part 621 may be formed in the lower region of the lens 620, and may be disposed at a center of the lens 620 as shown in the drawings. The light entering part 621 may have a substantially concave shape, as a bell, as shown in FIGS. 13 to 15. In the illustrated exemplary embodiment, the light entering part 621 has a concave inner surface as the light incident surface 621a, and the light incident surface 621a includes a light incident vertical surface 621aa and a light incident inclined surface 621ab. The light incident vertical surface 621aa is formed at an entrance of the light entering part 621, which is substantially perpendicular to a horizontal surface and extends to a predetermined distance. The light incident inclined surface 621ab is formed to extend from the end of light incident vertical surface 621aa.

The light incident inclined surface 621ab may be disposed upwardly from the light incident vertical surface 621aa, and may have a curved surface as a whole. Further, the light incident vertical surface 621aa and a protruding surface 631 of the lens 620 may be extended. The protruding surface 631 of the lens 620 will be described later.

The entrance of the light entering part 621 according to the illustrated exemplary embodiment has a substantially elliptical shape, as shown in FIG. 13, and may have a major axis and a minor axis. In this case, the major axis direction of light entering part 621 is defined as a y-axis direction, and the minor axis direction of the light entering part 621 is defined as an x-axis direction.

In the illustrated exemplary embodiment, a lower surface 625 of the lens 620 may have a substantially planar shape in general. The protruding surface (or protruding part) 631 may be formed on the lower surface 625 of the lens 620 around the entrance of the light entering part 621. The protruding surface 631, as shown in the drawing, may be formed to have a shape, in which a portion of a spherical shape is coupled to the lower surface 625 of the lens 620. More particularly, the protruding surface 631 may have a partially spherical shape and coupled to the lower surface 625 of the lens 620, and accordingly, as shown in FIGS. 14 and 15, it may be formed in the shape protruding from the lower surface 625 of the lens 620.

The light entering part 621 may be disposed at a center of the protruding surface 131, and the light incidence vertical surface 621aa of the light entering part 621 may be connected to the protruding surface 631. The center of the protruding surface 631 and the center of the light entering part 621 may coincide with each other in a plan view of the lens 620.

Moreover, a plurality of legs 629 is disposed on the lower surface 625 of the lens 620, and the plurality of legs 629 may be disposed outside of the protruding surface 631. In some exemplary embodiments, when the protruding surface 631 is formed on the lower surface 625 of the lens 620, the legs 629 may be disposed outside of the protruding surface 631 so as not to interfere with the protruding surface 631.

The plurality of legs 629 may be disposed at a longer interval along the major axis of the light entering part 621. For example, four legs 629 may be formed on the lower surface of the lens 620, two of which may be disposed at a first interval W1 on one side of the light entering part 621 at the major axis, and the remaining two legs 629 may be disposed at a second interval W2 on an opposite side to the one side of the light entering part 621 at the major axis. In this case, the first interval W1 and the second interval W2 may be substantially equal to each other. An interval between the two legs 629 disposed on the one side of the light entering part 621 and the two legs 629 disposed on the other side may be longer than the first and second intervals W1 and W2.

The light exiting part 623 forms an outer shape of the lens 620, and is a surface through which light incident on the lens 620 is emitted to the outside. A cross-sectional view of the light exiting part 623 may have a substantially elliptical shape having a major axis in the x-axis direction and a minor axis in the y-axis direction, and the light exiting part 623 may have a substantially convex shape having a predetermined curvature.

In the illustrated exemplary embodiment, the major axis of the light exiting part 123 and the major axis of the light entering part 621 may be arranged substantially perpendicular to each other.

Accordingly, light emitted from the light emitting device 610 may be relatively incident more toward the major axis of the light exiting part 623.

Moreover, the lens 620 may further include a flange 627 connecting the light exiting part 623 and the lower surface 620 of the lens 620. The flange 627 may be disposed along the outer periphery of the light exiting part 623, and a longitudinal side surface of the flange 627 may be subsequently perpendicular to the lower surface 625 of the lens 620. In this case, a thickness of the flange 627 may vary depending on a location of the light exiting part 623, and the thickness of the flange 627 located at the major axis of the light exiting part 623 may be relatively thicker than the thickness of the flange 627 located at the minor axis of the light exiting part 623. Accordingly, a boundary 627a between the flange 627 and the light exiting part 623 may be formed as a curved line.

In the illustrated exemplary embodiment, when a height of the light incident vertical surface 621aa of the light entering part 621 and the thickness of the flange 627 are compared with each other, the height of the light incident vertical surface 621aa of the light entering part 621 may be smaller than the thickness of the flange 627. More particularly, the height of the light incident vertical surface 621aa may be smaller than the thickness of the flange 627 at the minor axis of the light exiting part 623, in which the thickness of the flange 627 is minimum.

Figure 16:
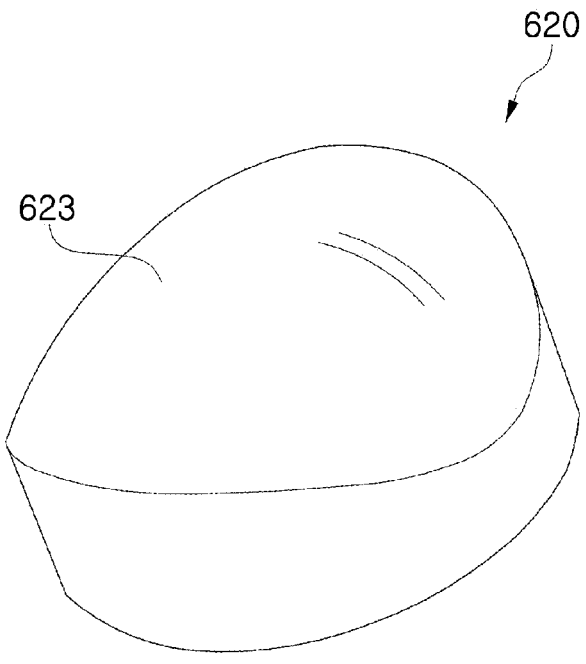
FIG. 16 is a view for illustrating the light exiting part of the lens included in the light emitting module of FIG. 13 according to an exemplary embodiment.

FIG. 16 is a view for illustrating the light exiting part of the lens included in the light emitting module of FIG. 13 according to an exemplary embodiment.

The curvature of the light exiting part 623 of the lens 620 included in the light emitting module 600 may be described with reference to FIG. 16. According to an exemplary embodiment, the lens 620 may be designed by using a function used for designing an anamorphic lens, which is an optical lens for compressing or converting a wide shot scene to a standard size region on the surface of the lens.

More particularly, an asymmetric constant "B" may be added to design an aspherical lens in the x- and y-axes. That is, a coordinate value of the surface of the light exiting part 623 according to the illustrated exemplary embodiment may be expressed as a "z" value according to Equation 1 depending on x and y values.

$$z = \frac{\left(c_x x^2 + c_y y^2\right)}{1 + \sqrt{(1 - (1 + k_x)c_x^2 x^2 - (1 - k_y)c_y^2 y^2}} + \qquad \text{[Equation 1]}$$

$$\sum_{n=2}^{10} A_{2n}\left[(1 - B_{2n})x^2 + (1 - B_{2n})y^2\right]^n$$

An anamorphic surface shape provides a surface having a 20th order aspherical surface shape that is different each other in the Y-Z plane and the X-Z plane, but still has a symmetrical shape in each plane. In particular, the anamorphic surface shape is not an actual asymmetric surface form. The anamorphic surface may be entered in Equation 1 with curvature and conic constants and symmetric and asymmetric coefficients with respect to each plane.

Here, the constant A is the symmetry coefficient with respect to the aspherical shape in the Y-Z plane, and the constant B is the asymmetry coefficient, which is different in aspherical surface coefficients between the Y-X plane and the X-Z plane. If the curvature "c" is equal, and the Conic constant "k" is the same, and the constant B is all zero, Equation 1 can be reduced to a standard rotational symmetric polynomial aspherical surface.

As described above, an anamorphic aspherical surface provides a surface having a different 20th order aspheric surface shape in the Y-Z plane and the X-Z plane, but it may still be symmetrical in each plane. X-Y polynomials can be used for a full asymmetric surface.

This anamorphic aspheric surface may be entered with the curvature and Conic constants "k" and the symmetric and asymmetric surface coefficients with respect to each plane.

The constant "k" is the Conical constant, and $k = -(e^2)$. Here, the constant "k" value is related to a common conical shape as follows. If k=0, it is a sphere. If $-1 < k < 0$, it is an ellipse having the major axis in the z-axis, if k=−1, it is a parabola, if k<−1, it is a hyperbola, and if k>0, it is an oblate sphere.

Here, $k_x$ is the Conic constant in the x-axis, and $k_y$ is the Conic constant in the y-axis. And $c_x$ denotes the curvature in the x-axis, and $c_y$ denotes the curvature in the y-axis.

For example, if $c_x = c_y$, $k_x = k_y$, and all B is zero, Equation 1 reduces to the standard rotational symmetric polynomial aspherical surface.

Figure 17:
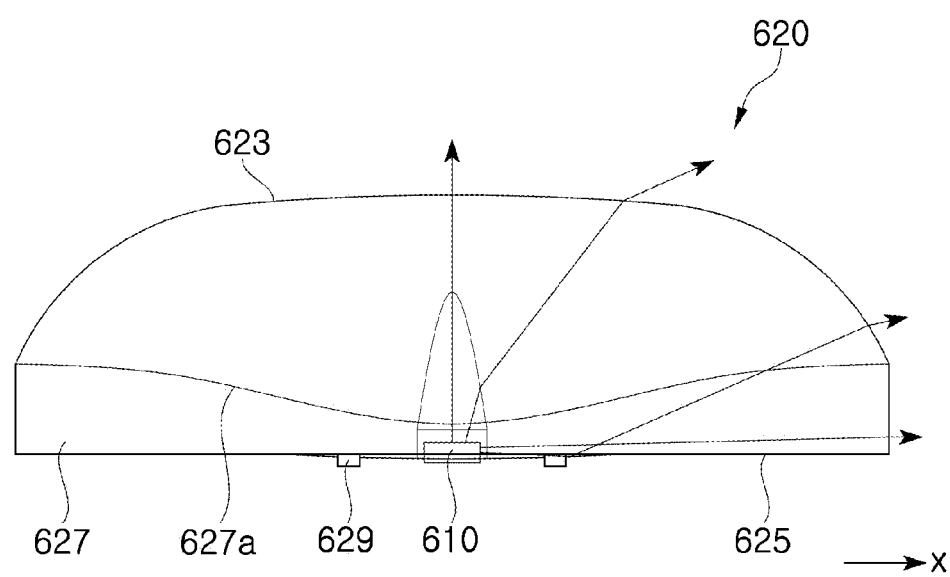
FIG. 17 is a view illustrating light emitted from the light emitting module of FIG. 13 with a side view of the major axis of the light emitting module of FIG. 13 according to an exemplary embodiment.

FIG. 17 is a view illustrating light emitted from the light emitting module of FIG. 13 with a side view showing the major axis of the light emitting module according to an exemplary embodiment.

Referring to FIG. 17, a path of light emitted in the major axis direction will be described. The light emitting device 610 according to an exemplary embodiment emits light both from an upper surface and a side surface of the light emitting device 610. Accordingly, light emitted from the upper surface of the light emitting device 610 is incident on the lens 620 over the light incident surface 621a of the lens 620, and is emitted through the light exiting part 623. Further, light incident on the light incident inclined surface 621ab of the lens 620 may be refracted and emitted through the light exiting part 623. Moreover, light emitted to the side surface of the light emitting device 610 may be incident on the lens 620 through the light incident vertical surface 621aa and may be directly emitted sidewards through the flange 627 of the lens 620.

In addition, a portion of light emitted from the side surface of the light emitting device 610 may be reflected upward from the protruding surface 631 coupled to the lower surface 625 of the lens 620, and may be emitted to the outside through the light exiting part 623. Moreover, light emitted from the light emitting device 610 may be incident on the lens 620 through the light incident surface 621*a*, and may be reflected without being emitted through the light exiting part 623. At this time, a portion of the reflected light may be re-reflected from the protruding surface 631 and may be emitted again to the outside through the light exiting part 623.

As described above, light emitted from the light emitting device 610 according to an exemplary embodiment may be reflected or re-reflected from the protruding surface 631 coupled to the lower surface of the lens 620, and may be emitted through the light exiting part 623 of the lens 620, thereby increasing the output of light emitted through the light exiting part 623 of the lens 620.

Moreover, the portion of light emitted to the side surface of the light emitting device 610 may be incident on the lens 620 through the light incident vertical surface 621*aa* and may be directly emitted through the flange 627 of the lens 620. Accordingly, the output of light emitted from the side surface of the lens 620 may be increased. According to the present invention, since a distribution of light emitted from the light emitting module may have a near rectangular shape, there is an effect that uniform light may be emitted to the outside by combination with the distribution of light emitted from adjacent light emitting modules.

According to exemplary embodiments, since a distribution of light emitted from the light emitting module may have a near rectangular shape, uniform light may be emitted to the outside by combination with the distribution of light emitted from adjacent light emitting modules.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light module, comprising:
   a substrate;
   a light emitting device disposed on the substrate; and
   a lens disposed over the light emitting device to spread light emitted from the light emitting device, the lens comprising:
      a light entering surface having a concave shape in a lower region of the lens, and on which the light emitted from the light emitting device is to be incident;
      a light exiting surface through which the incident light is emitted to an outside of the lens;
      a plurality of legs coupled to a lower surface of the lens; and
      a flange connecting the light exiting surface and the lower surface of the lens,
   wherein the light entering surface includes a light incident curved surface between the lower surface of the lens and the light exiting surface,
   wherein the flange protrudes further out than the light exiting surface, and
   wherein the lower surface of the lens includes a inclined region closer to an inner edge of the lower surface and includes a substantially planar region closer to an outer edge of the lower surface and the plurality of legs are disposed outside of the inclined region.

2. The light module of claim 1, wherein the lens further includes a gate that protrudes outside of the flange.

3. The light module of claim 1, wherein the inclined region has a spherical shape.

4. The light module of claim 3, wherein a center of the light entering surface coincides with a center of the spherical shape.

5. The light module of claim 1, wherein the flange has a substantially circular shape in a plan view.

6. The light module of claim 1, wherein two of the plurality of legs are spaced apart by a first interval from each other, and other two of the plurality of legs are spaced apart from the two of the plurality of legs by a second interval.

7. The light module of claim 6, wherein the two of the plurality of legs and the other two of the plurality of legs are spaced apart by a distance that is longer than the first and second intervals.

8. A light module, comprising:
   a substrate;
   a light emitting device disposed on the substrate; and
   a lens disposed over the light emitting device to spread light emitted from the light emitting device, the lens comprising:
      a light entering surface having a concave shape in a lower region of the lens, and on which the light emitted from the light emitting device is to be incident;
      a light exiting surface through which the incident light is emitted to an outside of the lens;
      a plurality of legs coupled to a lower surface of the lens; and
      a flange connecting the light exiting surface and the lower surface of the lens,
   wherein the light entering surface includes a light incident curved surface between the lower surface of the lens and the light exiting surface,
   wherein the flange protrudes further out than the light exiting surface, and
   wherein the lower surface of the lens includes a protrusion region closer to an inner edge of the lower surface and includes a substantially planar region closer to an outer edge of the lower surface, and the plurality of legs are disposed outside of the protrusion region.

9. The light module of claim 8, wherein the lens further includes a gate that protrudes outside of the flange.

10. The light module of claim 8, wherein the protrusion region has a spherical shape.

11. The light module of claim 10, wherein a center of the light entering surface coincides with a center of the spherical shape.

12. The light module of claim 8, wherein the flange has a substantially circular shape in a plan view.

13. The light module of claim 8, wherein two of the plurality of legs are spaced apart by a first interval from each other, and other two of the plurality of legs are spaced apart from the two of the plurality of legs by a second interval.

14. The light module of claim 13, wherein the two of the plurality of legs and the other two of the plurality of legs are spaced apart by a distance that is longer than the first and second intervals.

15. A light module, comprising:
   a substrate;
   a light emitting device disposed on the substrate; and
   a lens disposed over the light emitting device to spread light emitted from the light emitting device, the lens comprising:

a light entering surface having a concave shape in a lower region of the lens, and on which the light emitted from the light emitting device is to be incident;

a light exiting surface through which the incident light is emitted to an outside of the lens;

a plurality of legs coupled to a lower surface of the lens; and a flange connecting the light exiting surface and the lower surface of the lens, wherein the light entering surface includes a light incident curved surface between the lower surface of the lens and the light exiting surface, wherein the flange protrudes further out than the light exiting surface, and wherein the lower surface of the lens includes a inclined region closer to an inner edge of the lower surface and includes a substantially planar region closer to an outer edge of the lower surface, and the plurality of legs are spaced apart from the inclined region.

16. The light module of claim 15, wherein the lens further includes a gate that protrudes outside of the flange.

17. The light module of claim 15, wherein the inclined region has a spherical shape.

18. The light module of claim 17, wherein a center of the light entering surface coincides with a center of the spherical shape.

19. The light module of claim 15, wherein two of the plurality of legs are spaced apart by a first interval from each other, and other two of the plurality of legs are spaced apart from the two of the plurality of legs by a second interval.

20. The light module of claim 19, wherein the two of the plurality of legs and the other two of the plurality of legs are spaced apart by a distance that is longer than the first and second intervals.

* * * * *